(12) United States Patent
Takazawa et al.

(10) Patent No.: US 7,222,272 B2
(45) Date of Patent: May 22, 2007

(54) SEMICONDUCTOR INTEGRATED CIRCUIT AND TESTING METHOD THEREOF

(75) Inventors: Yoshio Takazawa, Kodaira (JP); Toshio Yamada, Koganei (JP); Kazumasa Yanagisawa, Kokubunji (JP); Takashi Hayasaka, Tsurumi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 443 days.

(21) Appl. No.: 10/430,319

(22) Filed: May 7, 2003

(65) Prior Publication Data

US 2003/0222283 A1 Dec. 4, 2003

(30) Foreign Application Priority Data

May 29, 2002 (JP) .............................. 2002-155107

(51) Int. Cl.
G11C 29/26 (2006.01)
G11C 29/40 (2006.01)

(52) U.S. Cl. ..................................... 714/718; 714/702

(58) Field of Classification Search ................ 714/718, 714/25, 42, 54, 702, 719, 763; 365/200, 365/201
See application file for complete search history.

(56) References Cited

U.S. PATENT DOCUMENTS 4,484,303 A * 11/1984 Provanzano et al. .......... 712/37

6,336,088 B1 * 1/2002 Bauman et al. ............... 703/15
6,587,979 B1 * 7/2003 Kraus et al. ................. 714/720

FOREIGN PATENT DOCUMENTS

| JP | 11-250698 | 3/1998 |
|---|---|---|
| JP | 2000-111618 | 9/1998 |

\* cited by examiner

*Primary Examiner*—Albert Decady
*Assistant Examiner*—Dipakkumar Gandhi
(74) *Attorney, Agent, or Firm*—Reed Smith LLP; Stanley P. Fisher, Esq.; Juan Carlos A. Marquez, Esq.

(57) ABSTRACT

There are provided a plurality of bridge circuits which convert the test data information from a common test bus connected to a plurality of memories of different access data widths and address decode logics to the inherent access data widths of each memory and also convert the test address information from the common test bus to the inherent bit format of each memory to supply the result to the corresponding memory. The test address information is supplied in parallel from the common test bus to a plurality of memories to realize the parallel tests. Accordingly, the test data information can be supplied in parallel to a plurality of memories of different data widths and the address scan direction in the respective memories for the test address information can be uniformed to the particular direction depending on the inherent bit format. Thereby, the memory test efficiency by the match pattern for a plurality of on-chip memories can be improved.

7 Claims, 11 Drawing Sheets

FIG. 3

MEMORY 13 (SRAM 256w×16bit)

bit[15], bit[14], bit[13], bit[12] ... bit[2], bit[1], bit[0]

word line # / bit line #: 0 1 2 3 ... 254 255 a[7] 0 0 0 0 0 0 0 0 ... 1 1
a[6] 0 0 0 0 0 0 0 0 ... 1 1
a[5] 0 0 0 0 0 0 0 0 ... 1 1
a[4] 0 0 0 0 0 0 0 0 ... 1 1
a[3] 0 0 0 0 0 0 0 0 ... 1 1
a[2] 0 0 0 0 1 1 1 1 ... 1 1
a[1] 0 0 1 1 0 0 1 1 ... 1 1
a[0] 0 1 0 1 0 1 0 1 ... 0 1

RAM 256w×16bits LOGICAL ADDRESS
bit[15:0]  BIT
a[7:0]     ADDRESS

MEMORY 11 (SRAM 1kw×16bit)

a[1] a[0]
1 1   bit[15]
1 0   bit[15]
0 1   bit[15]
0 0   bit[15]
...
1 1   bit[1]
1 0   bit[1]
0 1   bit[0]
0 0   bit[0]
1 1   bit[0]
0 0   bit[0]

word line # / bit line #: 0 1 2 3 ... 254 255 a[9] 0 0 0 0 0 0 0 0 ... 1 1
a[8] 0 0 0 0 0 0 0 0 ... 1 1
a[7] 0 0 0 0 0 0 0 0 ... 1 1
a[6] 0 0 0 0 0 0 0 0 ... 1 1
a[5] 0 0 0 0 0 0 0 0 ... 1 1
a[4] 0 0 0 0 0 0 0 0 ... 1 1
a[3] 0 0 0 0 0 0 0 0 ... 1 1
a[2] 0 0 0 0 1 1 1 1 ... 1 1
a[1] 0 0 1 1 0 0 1 1 ... 1 1
a[0] 0 1 0 1 0 1 0 1 ... 0 1

RAM 1kw×16bits LOGICAL ADDRESS
bit[15:0]  BIT
a[9:0]     ADDRESS

*FIG. 8*

| br_chport | td_a | td_d | PORT 1 ADDRESS | PORT 1 DATA | PORT 2 ADDRESS | PORT 2 DATA |
|---|---|---|---|---|---|---|
| 0 | 0 | 0 | t_a | t_d | t_a | t_d |
| 0 | 0 | 1 | t_a | t_d | t_a | ALL BITS OF t_d ARE INVERTED |
| 0 | 1 | 0 | t_a | t_d | LOWER ONE BIT OF t_a IS INVERTED | t_d |
| 0 | 1 | 1 | t_a | t_d | LOWER ONE BIT OF t_a IS INVERTED | ALL BITS OF t_d ARE INVERTED |
| 1 | 0 | 0 | t_a | t_d | t_a | t_d |
| 1 | 0 | 1 | t_a | ALL BITS OF t_d ARE INVERTED | t_a | t_d |
| 1 | 1 | 0 | LOWER ONE BIT OF t_a IS INVERTED | t_d | t_a | t_d |
| 1 | 1 | 1 | LOWER ONE BIT OF t_a IS INVERTED | ALL BITS OF t_d ARE INVERTED | t_a | t_d |

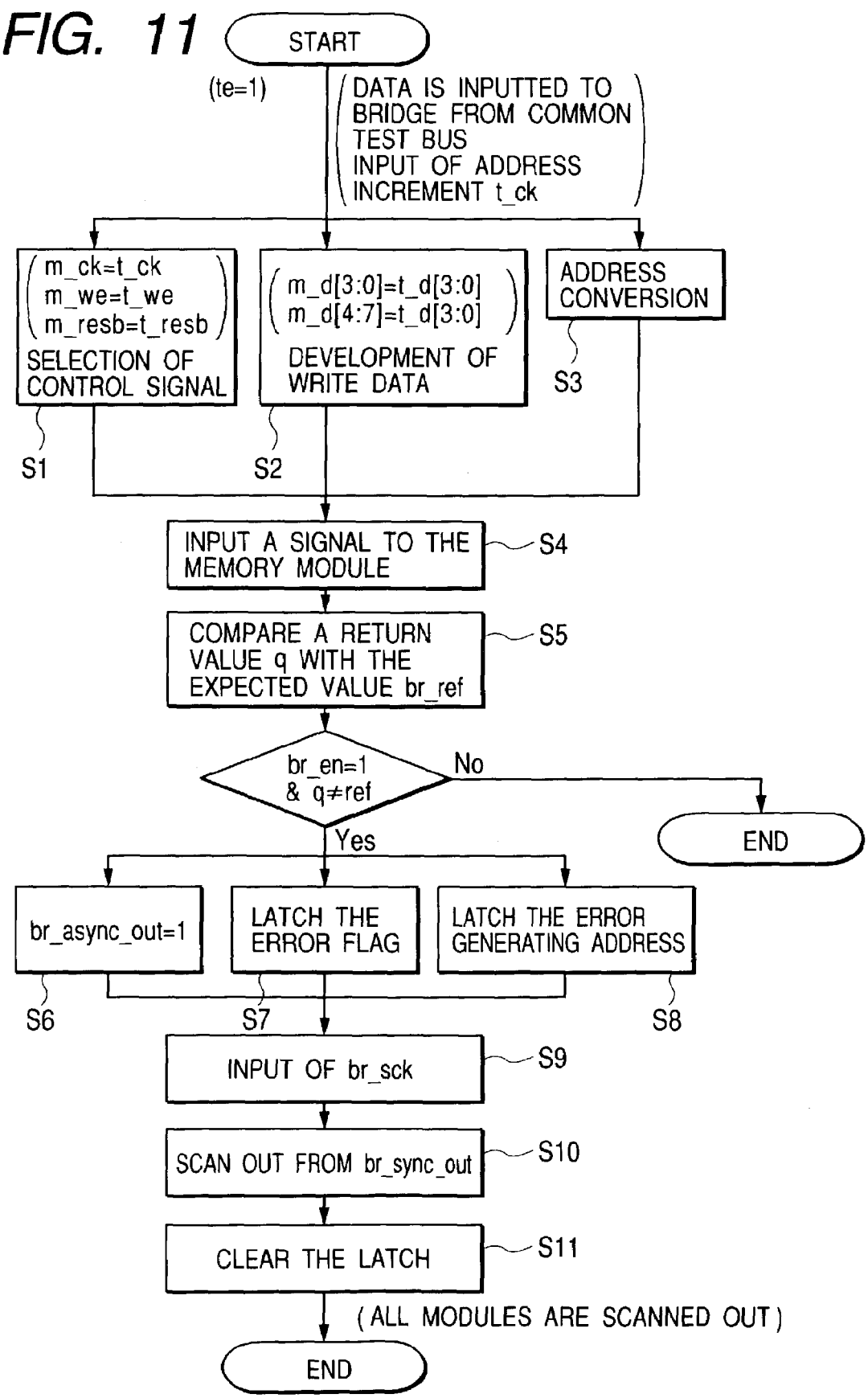

SEMICONDUCTOR INTEGRATED CIRCUIT AND TESTING METHOD THEREOF

BACKGROUND OF THE INVENTION

The present invention relates to a testing technique for a plurality of memories which are different in access data width and address decode logic and more specifically to the technique which can be effectively applied, for example, to a microcomputer which is provided with a plurality of on-chip memories or to a semiconductor integrated circuit such as so-called system LSI.

The Japanese Unexamined Patent Publication Nos. 2000-111618 and Heill (1999)-250698 are typical references describing the testing technique for a plurality of on-chip memories of a semiconductor integrated circuit of microcomputer and system LSI. These references also describe bit expansion of test data in the preceding stage of the on-chip memory.

Moreover, in the memory test, it is required to consider the influence of interference between memory cells, word line disturbance and bit line disturbance to ensure random access and therefore it is not practical to verify all cases because a large amount of testing time. Accordingly, as a method for effective verification, a method such as march pattern or walking pattern has been employed. In the verification method of this type, it is necessary to change the selecting direction of memory cells for physical allocation thereof depending on the predetermined rule wherein data is updated to the predetermined value while the memory cells of access unit are sequentially selected in the row direction for the memory cell array or while the memory cells are sequentially selected in the column direction.

SUMMARY OF THE INVENTION

However, in the conventional technique, it is not considered to convert in parallel the access data width to the inherent access data width for a plurality of memories of different access data width.

Moreover, in the prior art, it has been impossible, when a plurality of memories of different address decode logics are provided on the chip, to sequentially and uniformly update selection of memory cells in the column or raw direction with address increment because of difference of address decode logic even when address is inputted in common to such memories, in other words, because of difference of physical mapping of memory cells in the memory address space. Therefore, the memory test must have been performed with the method such as march pattern while the addresses are updated depending on the inherent address mapping of every on-chip memory. Accordingly, here rises a problem that test time of on-chip memory increases. Moreover, the similar problem occurs among a plurality of memories of different access data widths.

It is therefore an object of the present invention to provide a semiconductor integrated circuit device which can shorten the test time for a plurality of memories.

It is another object of the present invention to provide a testing method which can shorten the test time for a plurality of memories.

The aforementioned and other objects and novel features of the present invention will become apparent from the description of the present specification and the accompanying drawings of the present invention.

Typical inventions disclosed in the present specification of the present invention will be described briefly.

[1] A semiconductor integrated circuit including a plurality of memories of different access data widths and logic circuits which can control access to such memories comprises a common test bus connected to a plurality of memories and a plurality of bridge circuits which convert test data information from the common test bus to the inherent access data width of each memory and then supply such test data information to the corresponding memory, thereby supplying in parallel the test data information from the common test bus to a plurality of memories to enable the parallel tests.

According to the means described above, even when the test data information is supplied in parallel to a plurality of memories of different access data widths, the bridge circuit is capable of converting the test data information to the inherent access data width of the corresponding memory. The test efficiency of on-chip memory can be improved in the point that the test data information can be supplied in parallel to a plurality of memories of different access data widths.

A semiconductor integrated circuit including a plurality of memories of different address decode logics and logic circuits for access control of the memories comprises the common test bus connected to the plural memories and a plurality of bridge circuits to convert the test address information from the common test bus to the inherent bit format of each memory and then to supply such test address information to the corresponding memory, thereby supplying in parallel the test address information to a plurality memories from the common test bus to enable the parallel tests.

According to the means described above, even when the test address information is supplied in parallel to plural memories of different address decode logics, the bridge circuit converts the test address information to the inherent bit format of the corresponding memory. The scan direction for respective memories for test address information can be unified to the particular direction depending on the inherent bit format. In this point, the memory test efficiency due to the march pattern for a plurality of on-chip memories can be improved.

It is also possible to employ both bridge circuit for the test data information and bridge circuit for test address information.

[2] As a desirable profile of the present invention, the bridge circuit can select the convertible bit format depending on the test control information. The address scan direction by the march pattern or the like is generally selected at least in both raw direction and column direction and any selection thereof can easily be realized with the circuit.

As a desirable profile of the present invention, the bridge circuit is recommended to include a comparing means for comparing the read information from the memory with the expected value information from the common bus and a latch means for latching defective information of memory depending on the comparison result from the comparing means. Thereby, it becomes possible to sequentially obtain in serial the parallel test result for plural memories from the latch means.

The latch means described above may be formed of an address latch means for latching faulty address and a fault flag means for latching comparison result of faults. Location of generated fault also becomes apparent.

The bridge circuit may include a shift register means for scan path which serially provides an output by inputting an output of the latch means. Thereby, result of parallel tests can be sequentially and serially obtained easily from the latch means.

[3] As a desirable profile of the present invention, the bridge circuit described above comprises a comparing means for comparing read information from the memory with the expected value information from the common test bus and a gate means for obtaining a logical sum (OR) of the comparison result of the comparing means and comparison result output from another bridge circuit to output the result to still another bridge circuit. Here, it is recommended to serially connect a plurality of gate means to connect an output of the gate means of the preceding stage to the input of the gate means of the next gate.

According to the means described above, if an error due to mismatch of comparison is generated in any memory in the course of sequential progress of parallel tests accompanied by the address scan, while test data information is updated to a plurality of memories to update the test address information, an output of the gate means of the final stage changes. Therefore, continuation (Go)/stop (No-Go) of test can be determined while the parallel tests are performed to a plurality of memories by monitoring an output of the final stage.

[4] As a desirable profile of the present invention, it is recommended that at least a memory of a plurality of memories is a multi-port memory and a bridge circuit corresponding to such multi-port is capable of selecting a port connected to the common test bus and inputting disturbance information to the port selected for non-connection to the common test bus. The disturbance information may be a desired pattern data. Thereby, when the multi-port is provided, the port-to-port interference test may also be performed in parallel and thereby reliability of test for the multi-port memory can be improved.

[5] A testing method for testing in parallel a plurality of memories of different access data widths via the common test bus comprises a process to supply the test data information to the common test bus, a process to input the test data information from the common test bus and to convert the test data information to the inherent access data width of corresponding memory, a process to write in parallel the converted test data information to the corresponding memory, a process to read the written test data information from a plurality of memories and a process to generate memory error information by comparing the test data information read from the memory with the expected value information in unit of memory.

According to this testing method, the test data information can be converted to the inherent access data width of the corresponding memory even when the test data information is supplied in parallel to a plurality of memories of different access data widths. Test efficiency for a plurality of memories of different access data widths can be improved in the point that the test data information can be supplied in parallel to a plurality of memories of different access data widths.

The testing method for testing in parallel a plurality of memories of different address decode logics via the common test bus comprises a process to supply the test address information to the common test bus, a process to input the test address information from the common test bus and to convert the test address information to the inherent bit format of the corresponding memory, a process to write the test data series to the corresponding memory using the converted test address information, a process to read the written test data from a plurality of memories, and a process to generate the memory error information by comparing the test data read from the memory with the expected value information in unit of memory.

According to the testing method described above, the test address information can be converted to the inherent bit format of the corresponding memory even when the test address information is supplied in parallel to a plurality of memories of different address decode logics. Accordingly, the address scan direction in respective memories for the test address information can be united to the particular direction depending on the inherent bit format. In this point, the memory efficiency due to the march pattern for a plurality of memories of different address decode logics can be improved.

BRIEF DESCRIPTION OF THE DRAWINGS

FIG. 3 is a diagram illustrating an example of different decode logics of memory.

FIG. 8 is a diagram illustrating an example of operation modes of the port-to-port interference test.

FIG. 11 is a flowchart of the testing method for a semiconductor integrated circuit such as the microcomputer of FIG. 1.

DETAILED DESCRIPTION OF THE EMBODIMENTS

Figure 2:
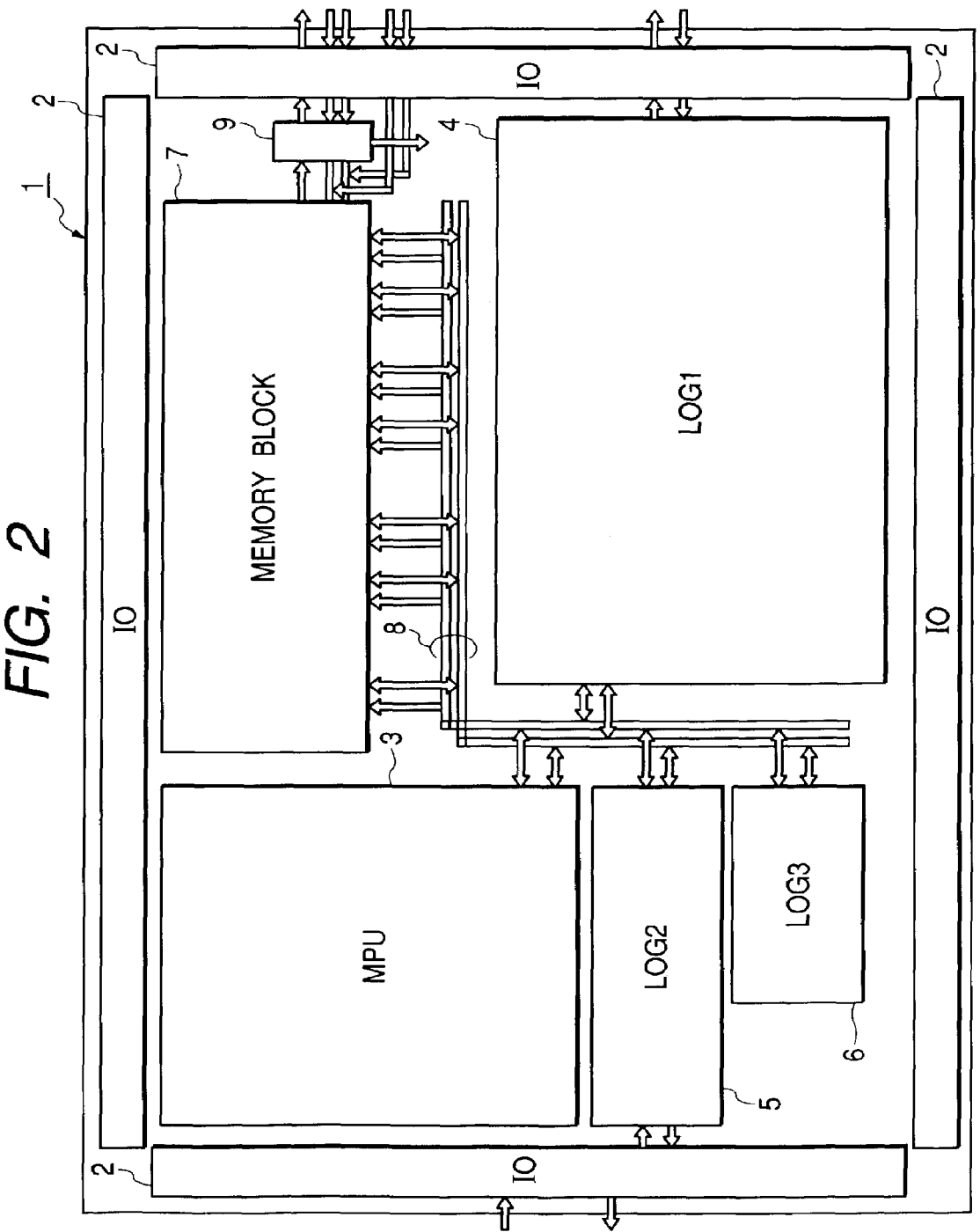
FIG. 2 is a structural plan view of a microcomputer as an example of the semiconductor integrated circuit of the present invention.

FIG. 2 is a structural plan view of a microcomputer as an example of the semiconductor integrated circuit of the present invention. The microcomputer illustrated in this figure is formed, for example, on a semiconductor substrate such as a single-crystal silicon with the CMOS integrated circuit manufacturing technique.

A microcomputer 1 comprises an input/output circuit (IO) 2 in the periphery of semiconductor substrate and includes at its internal side a microprocessor (MPU) 3, a first logic circuit (LOG1) 4, a second logic circuit (LOG2) 5, a third logic circuit (LOG3) 6 and a memory block 7 which are connected in common with an internal bus 8. The microcomputer is further provided with a test controller 9 which is the typical element as a test circuit. The internal bus 8 propagates address, data and control signal. The logic circuits 3 to 5 are, although not particularly restricted, an error correction circuit as an accelerator of MPU3, an interface controller such as ATAPI and an encoding decode logic.

Figure 1:
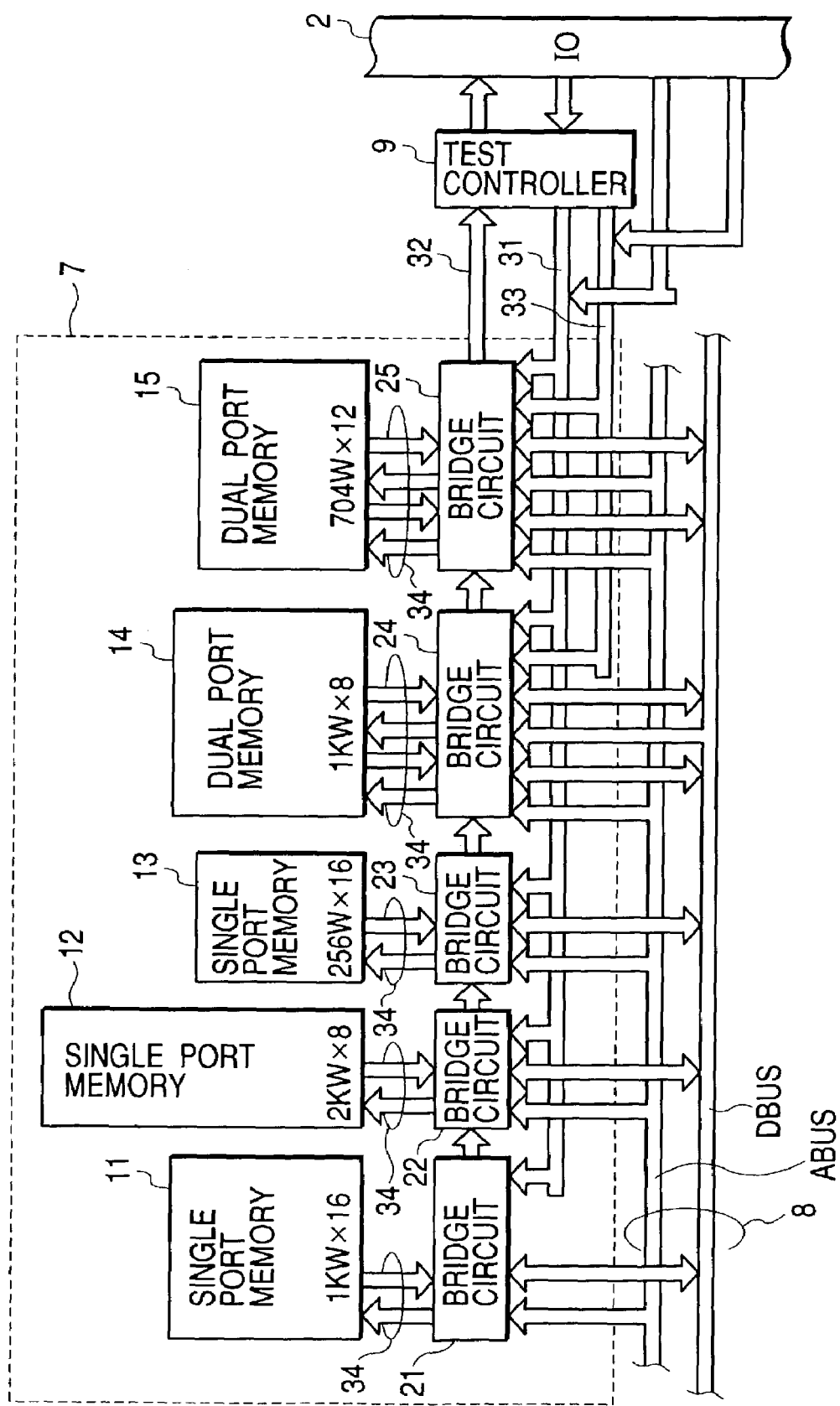
FIG. 1 is a block diagram illustrating an example of details of memory block comprised in a semiconductor integrated circuit of the present invention.

FIG. 1 illustrates details of a memory block 7. The memory block 7 includes three single-port memories 11 to 13 and two dual-port memories 14, 15. The memory 11 has the storage capacity of 1 KW×16 bits and its access data width is 16 bits. The memory 12 has the storage capacity of 2 KW×8 bits and its access data width is 8 bits. The memory 13 has the storage capacity of 256 W×16 bits and its access data width is 16 bits. The memory 14 has the storage capacity of 1 KW×8 bits and its access data width is 8 bits. The memory 15 has the storage capacity of 704 W×12 bits and its access data width is 12 bits.

The single-port memories 11, 12, 13 are formed, although not particularly restricted, of SRAM (Static Random Access Memory), including, although not illustrated, a memory cell array where memory cells of static latch mode are allocated like a matrix, a word driver for driving the word lines connected to the selection terminals of memory cells, a row decoder for selecting the word lines to be driven with the word driver, a column switch circuit for selectively connecting the bit lines connected to the data input/output terminal of memory cells to the common data lines, a column decoder for generating a selection signal of the column switch circuit, a sense amplifier for amplifying storage information read to the common data lines from the memory cells, a data input/output buffer for inputting write data to the common data line and outputting the read data detected with the sense amplifier, an address buffer for receiving the address signal to be supplied to the raw decoder and column decoder, and a timing controller for controlling memory operations by receiving the memory selection signal and access control signals such as read and write signals.

The dual-port memories 14, 15 include, for every memory cell, the word lines and bit lines for one access port and the word lines and bit lines for the other access ports and also include the word line selection system and column line selection system in the single-port memory for every port.

The memories 11 to 15 are different respectively in the address decode logics. For example, FIG. 3 illustrates examples of the decode logic of memory 13 and that of memory 11. As is apparent from FIG. 3, in the case of the decode logic of memory 13, the word number changes from 0 to 255 in the ascending order to result in the scan in the X direction by incrementing one by one (+1) the addresses a [0] to a [7]. Meanwhile, in the case of the decode logic of memory 11, the scan is performed first in the Y direction of the memory cell to be addressed when the addresses a [0] to a [9] are incremented one by one and the change in the upper side of the address a [2] will result in the scan in the X direction.

As illustrated in FIG. 1, the respective memories 11 to 15 are connected to the internal bus 8 via the bridge circuits 21 to 25. The bridge circuits 21 to 25 form a testing circuit, namely the BIST (Built In Self Test) circuit in combination with the test controller 9. The bridge circuits 21 to 25 are given the test data information, test address information and test control information or the like from the test controller 9 via the common test bus 31 and are thereby controlled in their operations. Moreover, the bridge circuits 21 to 25 convert the test data information sent from the common test bus 31 to the inherent access data widths of the memories 11 to 15 and then supply these access data widths to the corresponding memories 11 to 15. In addition, the bridge circuits 21 to 25 convert the test address information from the common test bus 31 to the inherent bit formats of the memories 11 to 15 and then supply these inherent bit formats to the corresponding memories 11 to 15. With changes of access data widths and bit formats of test address information by the bridge circuits 21 to 25, a plurality of memories 11 to 15 are all capable of conducting the parallel memory test through the scan in the X direction. The bridge circuits 21 to 25 are connected in series via the signal line 32 for transmission and reception of status and the result of parallel tests of memories 11 to 15 is supplied to the test controller 9 through propagation via the signal line 32 for transmission and reception of status.

The dual-port common test bus 33 is connected to the bridge circuits 24, 25 corresponding to the dual-port memories 14, 15 and when the dual-port memories 14, 15 are tested via the common test bus 31, it becomes possible to give the disturb information for the test object port via the dual-port common test bus 33 to the ports which are not the objects of test.

In FIG. 1, the address bus ABUS and data bus DBUS are indicated as the typical internal bus 8. The memories 11 to 15 and bridge circuits 21 to 25 are respectively connected with the exclusive signal line group (memory to bridge bus) 34.

Figure 4:
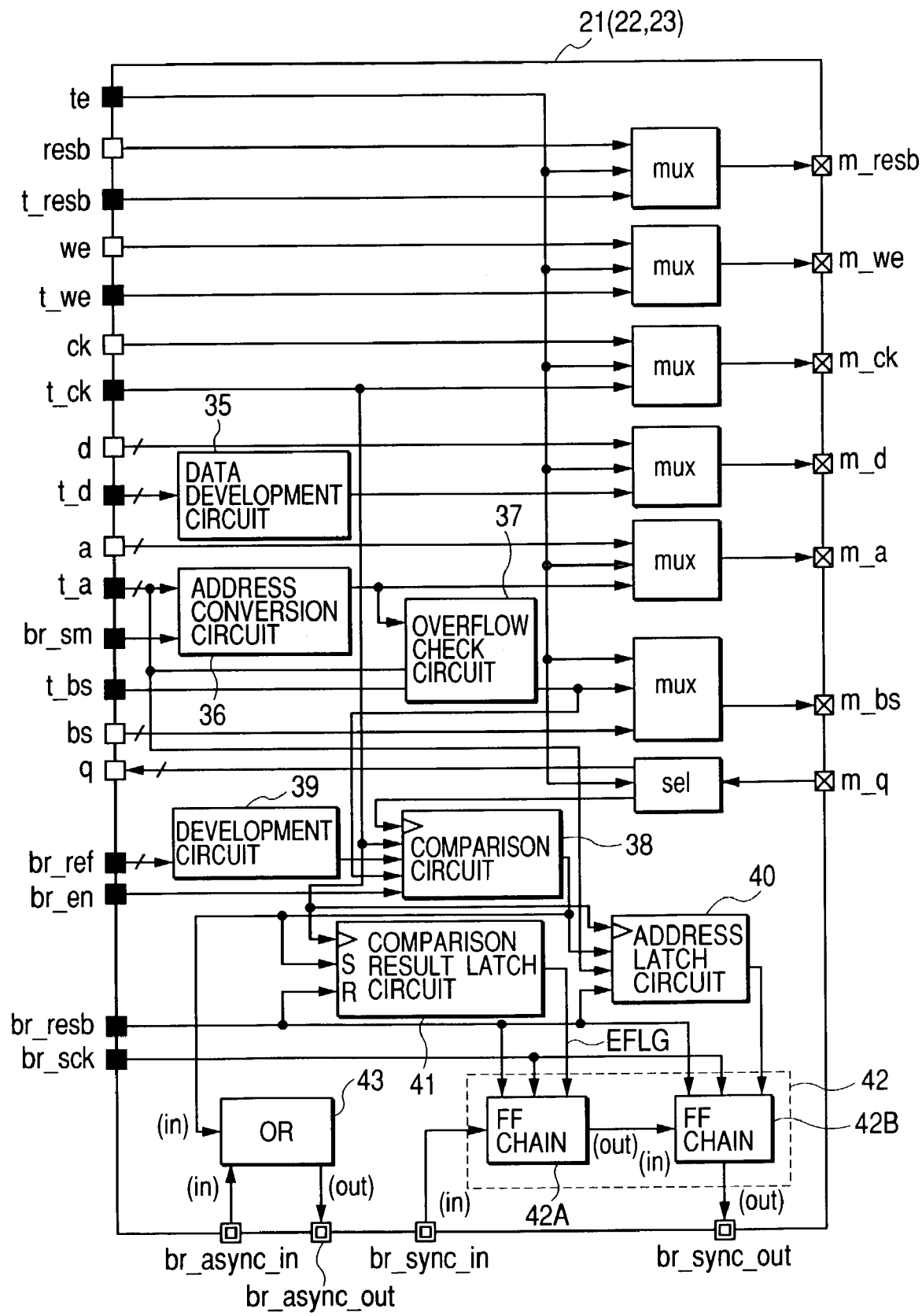
FIG. 4 is a block diagram illustrating an example of a basic structure of a bridge circuit for single port memory.

FIG. 4 illustrates an example of basic structure of the bridge circuit 21 (22, 23) for single-port memory. The input signals (input signals from the terminals ■ illustrated) from the common test bus 31 used in the memory test are as follows. Namely, te is a switching signal for switching input in the normal operation and input in the test mode, t_resb is a memory reset signal, t_we is a write control signal, t_bs is a module selection signal. t_ck is a clock signal, t_d is a test data input signal (test data information) compressed to 4 bits, t_a is an address signal (test address information). br_sm is a signal for selecting the address scan system. br_ref is an expected value input signal for judging memory output, br_en is a signal for controlling judgment of bridge, br_resb is a reset signal of bridge circuit, br_sck is a scan clock input signal.

The input/output signals from the signal line 32 for transmission and reception of status (input/output signals from the terminals indicated by double □ in the figure) are as follows. br_async_in is a signal for asynchronously inputting an error signal. br_async_out is a signal for asynchronously transmitting an error signal. br_sync_in is an input signal for receiving a state of the bridge circuit in synchronization with the signal br_sck. br_sync_out is a transmitting signal for transmitting a state of the bridge circuit in synchronization with the signal br_sck.

The signals to be inputted or outputted via the memory-to-bridge bus 34 (input/output signals from the terminals indicated by □ with x in the figure) are as follows. A memory control signal, for example, m_resb is a reset signal, m_we is a write control signal, m_bs is a module selection signal, m_ck is a clock signal, m_d is a write data to the memory, m_a is an access address signal, and m_q is a read data from the memory.

The signals in the normal operations to be inputted or outputted via the internal bus 8 (input/output signals from the terminals indicated by □ in the figure) are as follows. A memory control signal, for example, resb is a reset signal, we is a write control signal, bs is a module selection signal, ck is a clock signal, d is an input data, a is an address signal, and q is a memory output data.

A multiplexer mux selects any one of the internal bus 8 or common test bus 31 to be connected to the bridge-to-memory bus 34 with a signal te. A selector sel selects the read data from the memory to be outputted to the internal bus 8 or to be supplied to a comparison circuit 38 for test described later with the signal te.

A data development circuit 35 develops a write data t_d as the test data information supplied in unit of four bits from the common test bus 31 into the number of parallel bits of the inherent data m_d, namely the access data width of the corresponding memory and then outputs this data to the subsequent stage. For example, a circuit for data-development to develop the test data information t_d of four bits to the data of 16 bits may be formed of an expanded route which outputs four parallel data of the test data information t_d by respectively expanding each bit of the test data information t_d to four bits. Accordingly, data development is performed in the mode that the test data information of four bits is repeated in the pattern of t_d. It is enough that the number of times of repetition for data development is determined to a fixed value depending on the access data width of the corresponding memory.

As address conversion circuit 36 converts the test address information t_a from the common test bus 31 to the inherent bit format of the corresponding memory and outputs this data to the subsequent stage. A kind of bit format to be converted, the bit format depending on the address scan direction may be designated with the signal br_sm. An overflow check circuit 37 detects whether the address converted with the address conversion circuit 36 has exceeded or not the address range of the corresponding memory. This overflow check circuit 37 inverts a module selection signal m_bs to the non-selection level when it is detected that the address has exceeded the address range.

During the memory test, the data m_d developed by the data development circuit 35 is written to the address m_a converted by the address conversion circuit 36. When the written data is read from the memory, it is inputted to the bridge circuit 21 (22, 23) as a return data m_q. The return data m_q is supplied to the comparison circuit 38 via the selector sel, while the expected value data br_ref is also supplied to the comparison circuit 38 via the development circuit 39 and both input data are judged whether these are matched or mismatched. The comparison output is inverted, when the data are mismatched, to the logical value "1" from the logical value "0". In short, generation of test error is detected with such conversion. When generation of test error is detected, a test address information t_a for test is latched by an address latch circuit 40 as fault information, namely as an error information. As a result, a comparison result latch circuit 41 is set and an error flag EFLG which is an output of the comparison result latch circuit 41 is set to the logical level "1". Respective latch operations are synchronized with the clock signal t_ck for test.

An external output of the fault information obtained is performed with a shift register 42 and a logical sum (OR) gate 43 forming a part of the scan path.

The logical sum gate 43 forms and outputs a logical sum of the comparison result of the comparison circuit 38 and the comparison result of the comparison circuit from the bridge circuit in the preceding stage. Accordingly, when the test address information is updated while the test data information is given to a plurality of memories 11 to 15 and when an mismatch error is detected by the comparison circuit 38 in any of the memories while the parallel tests including the address scan are sequentially performed, such change is reflected on an output signal br_async_out of the bridge circuit 25 in the final stage. By monitoring the output in the final stage via the test controller 9 by means of external tester, the test can be judged for continuation or suspension (Go/No go) while the parallel tests are being performed for a plurality of memories.

The shift register 42 is formed of a first FF chain 42A and a second FF chain 42B of the serial connection in which the flop-flop circuits are respectively allocated in serial. The second FF chain 42B latches in parallel the address information latched by the address latch circuit 40, while the first FF chain 42A latches the error flag EFLG. A fault information latched by the shift register 42 is supplied to the test controller 9 from the signal line 32 for transmission and reception of status through the bridge circuits in synchronization with the scan clock br_sck. It is enough that the scan path output operation of this fault information is performed after the test controller 9 has stopped continuation of test when generation of error is generated, for example, with the output signal br_async_out of the bridge circuit 25 of the final stage. The timing in which the latch data is loaded to the shift register 42 from the address latch circuit 40 and comparison result latch circuit 41 is synchronized with the first change of pulse of the scan clock br_sck. Thereafter, the shift register 42 does not fetch outputs of the latch circuits 40, 41 until the signal br_resb is reset and performs only the data shift operation in synchronization with the change of scan clock br_sck.

In the scan path output operation, a tester (not illustrated) to receive an output of the test controller 9 can identify the memory which generates an error from the scan clock br_sck count value when the logical value "1" is detected by monitoring the error flag EFLG from the signal br_async_out while it is counting the number of scan clocks br_sck. It is because the number of shift stages of the shift register 42 in the bridge circuits 21 to 25 is already known. Moreover, this tester can identify the memory address in relation to the error generation by obtaining the address information immediately before the error flag EFLG of the logical value "1" from the signal br_sync_out.

Figure 5:
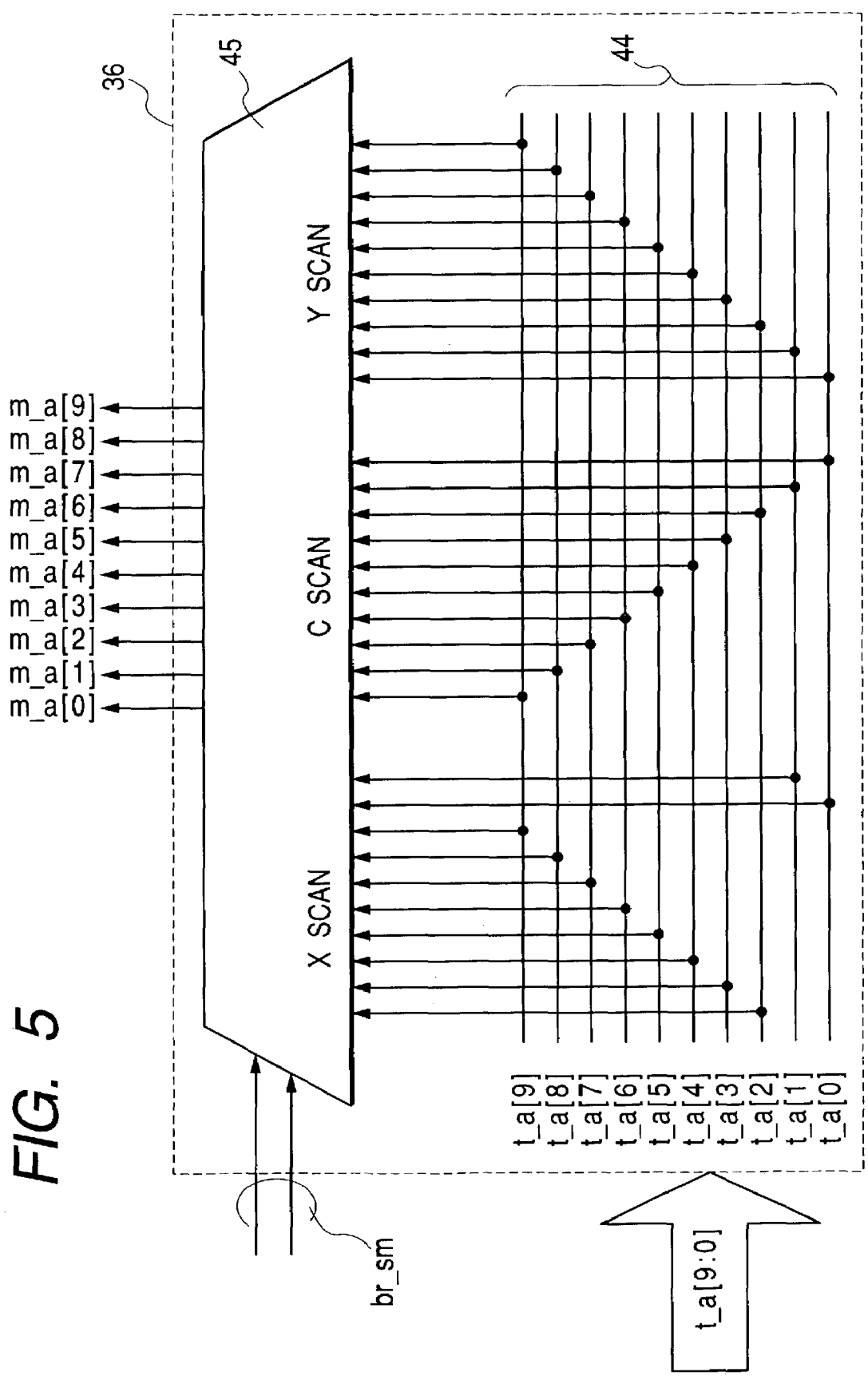
FIG. 5 is a circuit diagram illustrating an example of an address conversion circuit.

FIG. 5 illustrates an example of the address conversion circuit 36. This address conversion circuit 36 has a circuit structure built in the bridge circuit 21 corresponding to the memory 11 of 1 KW×16 bits. Formats of the input address signals t_a [9:0] and m_a [9:0] are changed to three kinds with the fixed method with the wiring logic 44 for X scan, C scan and Y scan. An output mode is selected from the three kinds of modes with the selector 45 depending on the 2-bit signal br_sm. The format change logic of FIG. 5 depends on the address decode logic in the memory 11 of FIG. 3. In this case, X scan means that the basic scan direction by address increment is X direction, Y scan means that the basic scan direction by address increment is Y direction, and C scan means that the scan direction by address increment is the direction where it is not in contact with the memory cell referred with the preceding address.

Figure 6:
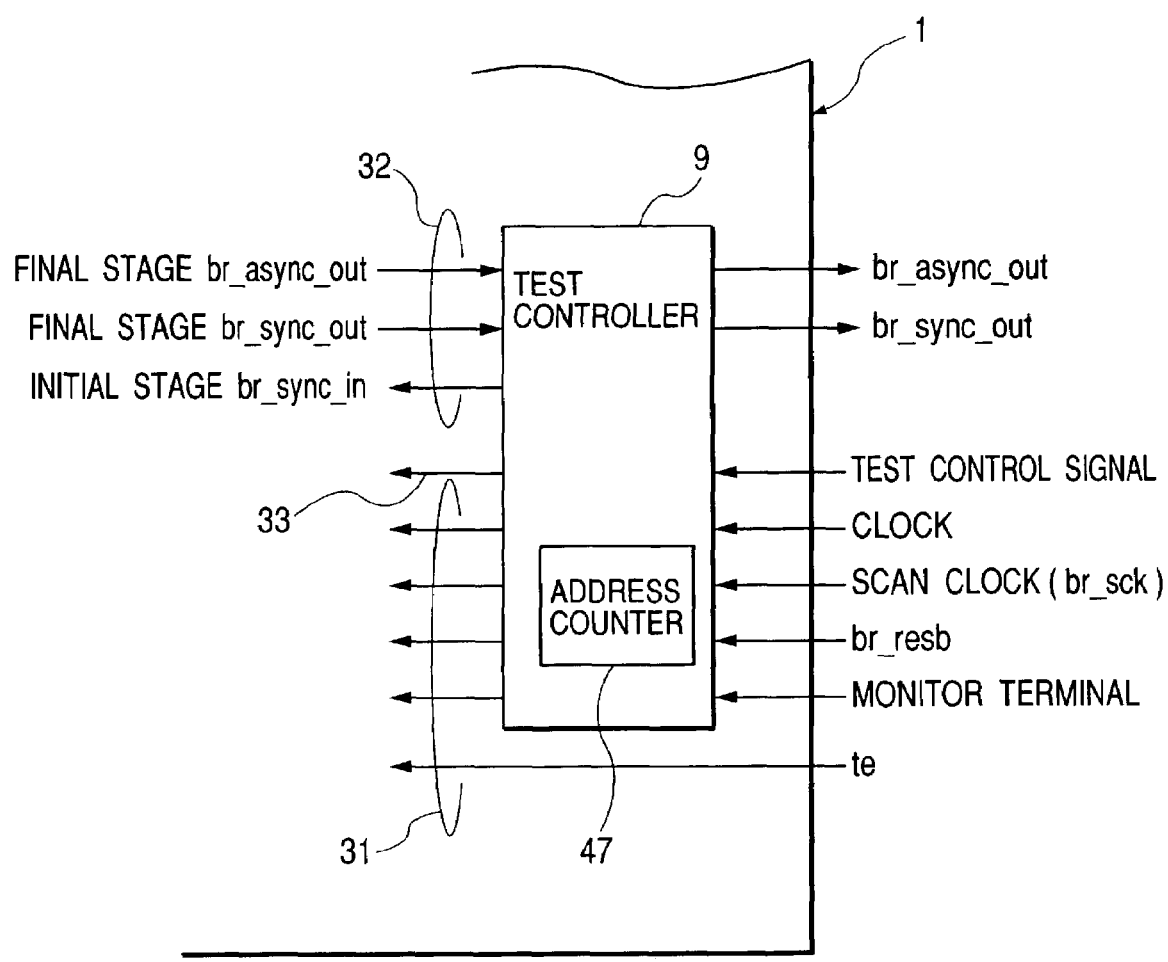
FIG. 6 is a diagram illustrating an example of input/output information of a test controller.

FIG. 6 illustrates an input/output information of the test controller 9. The signal led to the external side of a microcomputer 1 from the test controller 9 is interfaced with the tester not illustrated. The test controller 9 includes an address counter 47 which generates a test address information by sequential increment. The initial value of countering of the address counter 47 is given with the test control signal.

Figure 7:
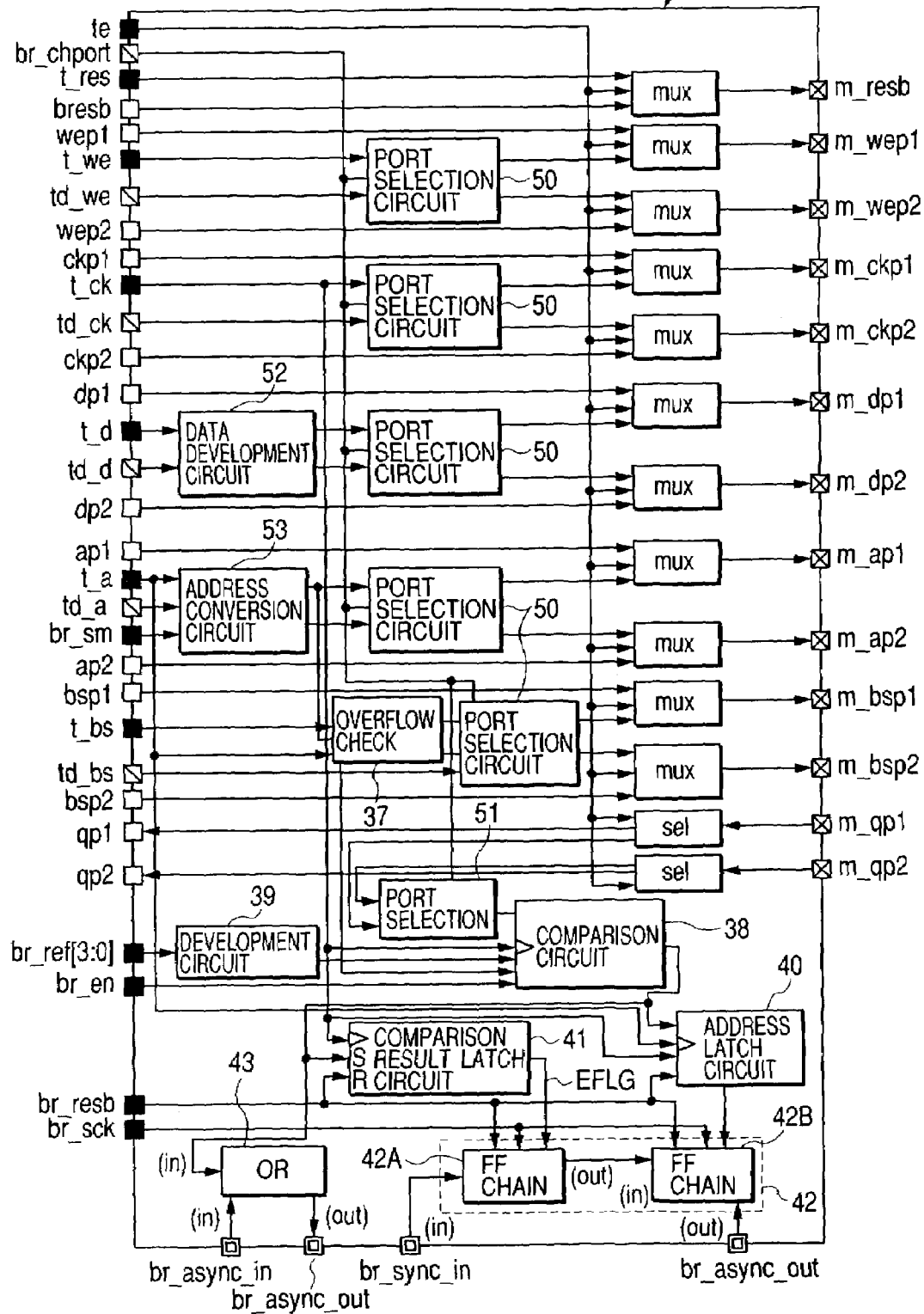
FIG. 7 is a block diagram illustrating an example of the basic structure of the bridge circuit for dual port.

FIG. 7 illustrates a basic structure of the bridge circuits 24, 25 for dual-port. Difference from FIG. 4 is that there are provided the function to select the test object port via the test common bus 31 and the function to input disturb information via the dual-port test common bus 33.

The input information from the common test bus 31 used for memory test (input signal from the terminals indicated by ■ illustrated in the figure) is identical to that of FIG. 4. The input/output signals from the signal line 32 for transmission and reception of status (input/output signals from the terminals indicated by double □ in the figure) are identical to that of FIG. 4. The input signals from the dual-port common signal line 33 used for the memory test (input signals from the terminals indicated by □ with an oblique line in the figure) are as follows. A memory signal, for example, td_resb is a reset signal, td_we is a write control signal, td_bs is a module selection signal, td_ck is a clock signal, td_d is a test data signal as the disturb information, td_a is an address signal of one bit, and br_chport is a control signal for controlling the dual-port so that anyone of the dual port corresponds to the common test bus 31 and the other corresponds to the dual-port common test bus 33.

The signals inputted or outputted via the memory-to-bridge bus 34 (input/output signals from the terminals indicated by □ with x in the figure) are as follows. m_resb is a reset signal. A memory control signal corresponding to the first access port, for example, m_wep1 is a write control signal, m_bsp1 is a module selection signal. Moreover, corresponding to the first port, m_ckp1 is a clock signal, m_dp1 is data, m_ap1 is an address, and m_qp1 is read data from the memory. A memory control signal corresponding to the second access port, for example, m_wep2 is a write control signal, m_bsp2 is a module selection signal. Moreover, corresponding to the second access port, m_ckp2 is a clock signal, m_dp2 is data, m_ap2 is an address, and m_qp2 is read data from the memory.

Signals in the normal operations inputted or outputted via the internal bus 8 (input/output signals from the terminals indicated by □ in the figure) are as follows. resb is a reset signal. A memory control signal corresponding to the first access port, for example, wep1 is a write control signal, and bsp1 is a module selection signal. Moreover, corresponding to the first access port, ckp1 is a clock signal, dp1 is write data, ap1 is an address signal, and qp1 is read data. A memory control signal corresponding to the second access port, for example, wep2 is a write control signal, and bsp2 is a module selection signal. Moreover, corresponding to the second access port, ckp2 is a clock signal, dp2 is write data, ap2 is an address signal, and qp2 is read data.

A port selection circuit 50 selects, depending on the signal br_chport, the first access port or second access port to connect to the common test bus 31 and the first access port or second access port to connect to the dual-port common test bus 33. The multiplexer mux selects, with the signal te, whether the access port is used for test or ordinary operation. The selector sel selects, with the signal te, whether the read data from the memory is outputted to the internal bus 8 or is supplied to the comparison circuit 38 for test. The port selection circuit 51 selects, with the signal te, that anyone of the data m_qp1 and m_p2 is supplied to the comparison circuit 38.

The data development circuit 52 develops the write data t_d as the test data information supplied in the unit of 4 bits from the common test bus 31 to the number of parallel bits, namely the access data width of the inherent data m_dp1, m_dp2 of the corresponding memory. Moreover, the data development circuit 52 generates all-bit inverted data of the data t_d developed in response to the logical value "1" of td_d. The developed test data information is supplied to one access port selected in the port selection circuit with the signal br_chport and the inverted data is supplied to the other access port.

The address conversion circuit 53 converts the test address information t_a from the common test bus 31 to the inherent bit format of the corresponding memory and then outputs the converted data to the subsequent stage. A kind of bit format to be converted, namely the bit format corresponding to the address scan direction may be designated with the signal br_sm. Moreover, the address conversion circuit 53 generates an address of adjacent memory cell by inverting the least significant bit of the address t_a converted in response to the logical level "1" of the signal td_a. The test address information of which bit format is converted is supplied to one access port selected in the port selection circuit with the signal br_chport and the least significant bit inverted address information is then supplied to the other access port.

When the memory test is performed via one access port with the data development and address conversion function, the disturb information can be given from the other access port by designating the adjacent memory cells of the test object memory cells and thereby the port-to-port interference in the dual-port memory can be tested.

FIG. 8 illustrates an operation mode of the port-to-port interference test. In FIG. 8, the address of the first access port (port 1 address) means m_ap1, while the data of the first access port (port 1 data) means m_dp1. The address of the second access port (port 2 address) means m_ap2, while the data of the second access port (port 2 data) means m_dp2.

Even in the bridge circuit for dual-port memory of FIG. 7, error judgment through comparison of the read data and expected value data and function of scan path output for the error judging result are identical to that in FIG. 4. The circuit block having the same function is designated with the same reference numerals and the detail description thereof are avoided.

Figure 9:
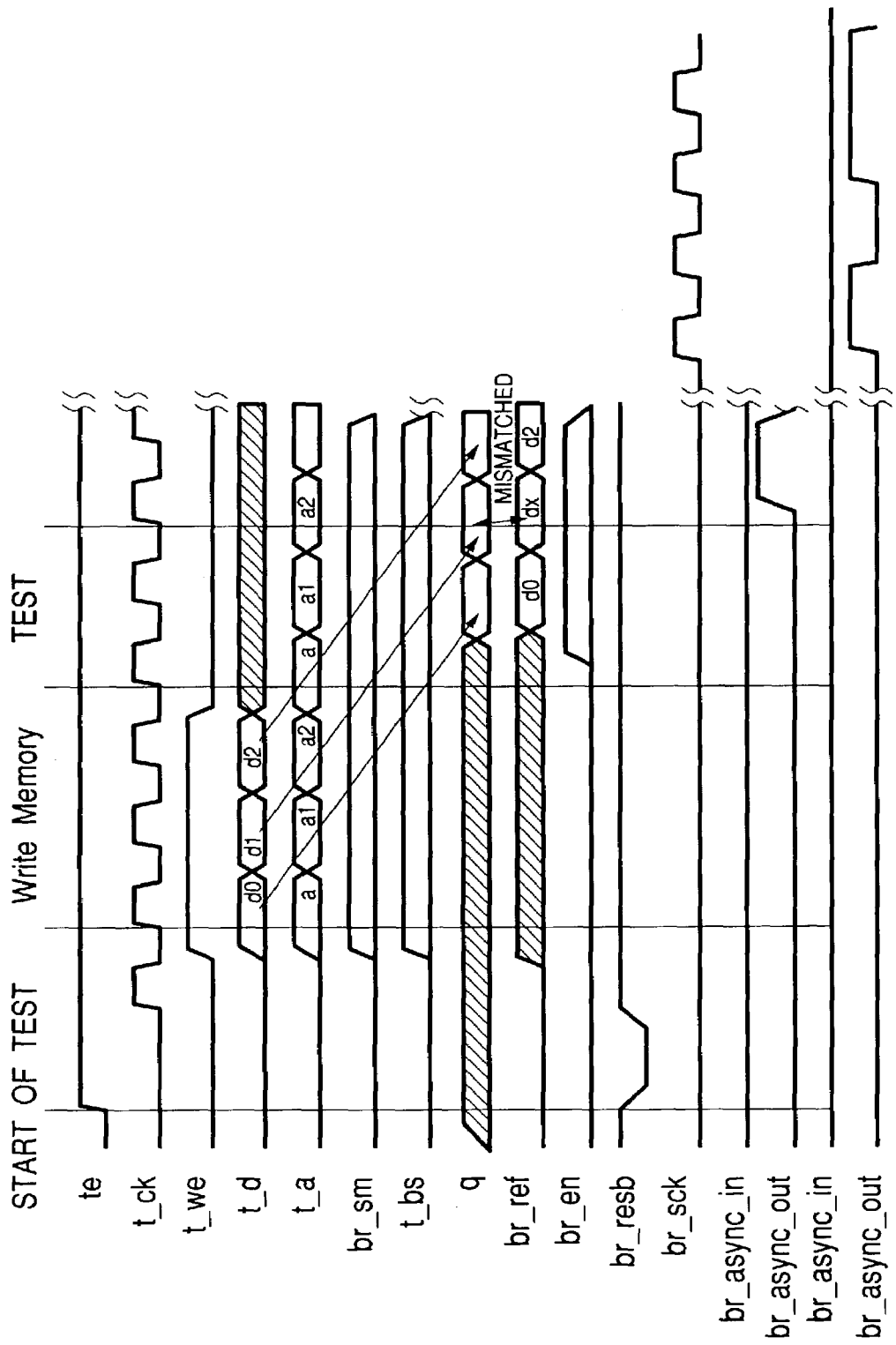
FIG. 9 is an operation timing chart of a single port memory in the parallel tests of memory block.

FIG. 9 illustrates an example of operation timing chart of one single-port memory in the parallel test operations for the memory block 7. Data d0, d1, and d2 are written to the addresses a, a1, and a2, and thereafter, data is read from the addresses a, a1, and a2. The read data is compared with the expected value data d0, dx, and d2. In this case, mismatch is detected by the comparison with the expected value data dx and the signal br_async_out is changed. When the scan-out of the test result from the external tester is instructed in response to this change, error information such as mismatch address information is outputted as br_sync_out in synchronization with the clock br_sck.

Figure 10:
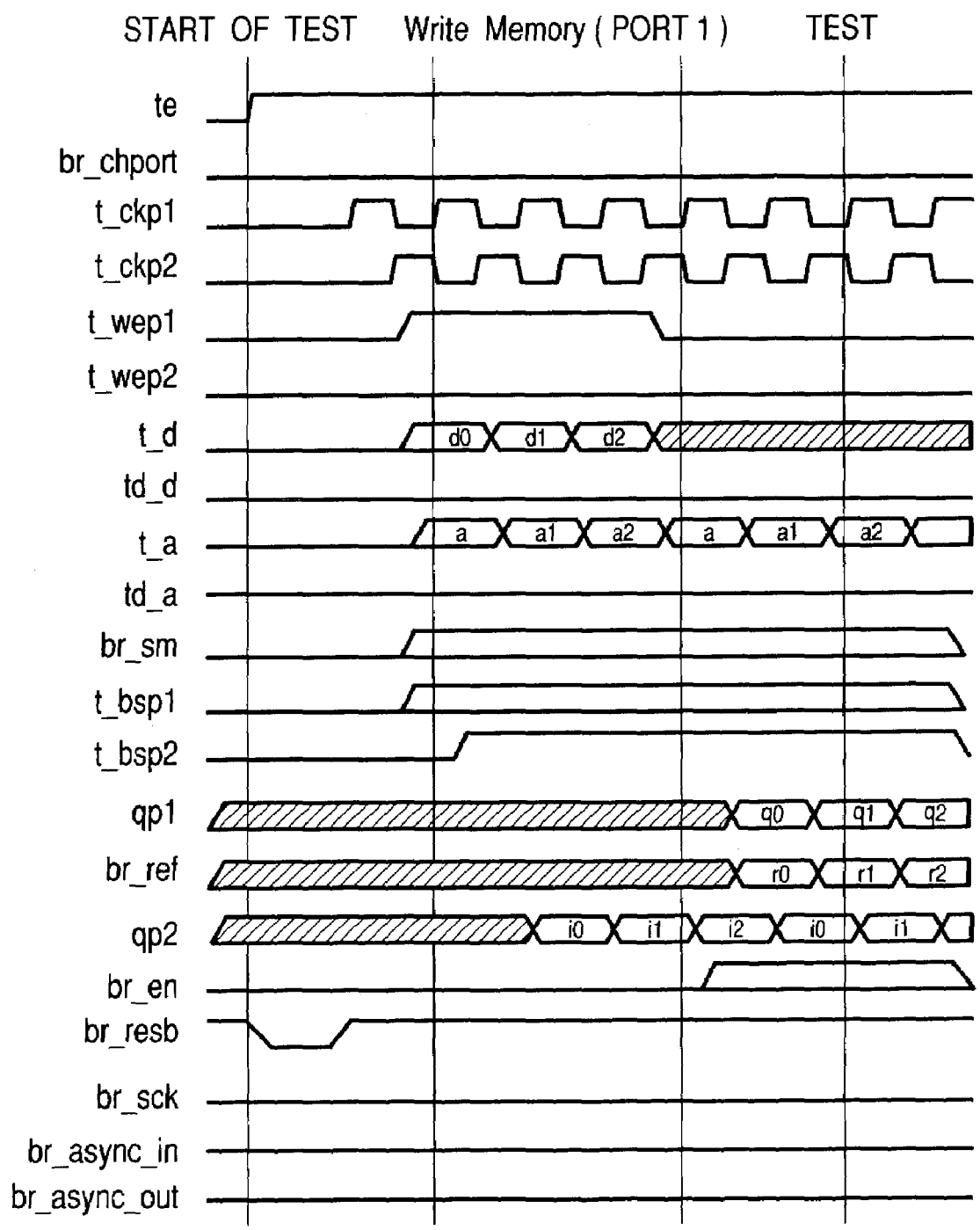
FIG. 10 is a timing chart of the port-to-port interference operation of one dual port memory in the parallel tests of memory block.

FIG. 10 illustrates an example of timing chart of the port-to-port interference operation in one dual-port memory during the parallel test operation for the memory block 7. The data d0, d1, d2 are written to the addresses a, a1, a2 from the port 1 and thereafter the data q0, q1, q2 of the addresses a, a1, a2 are read from the port 1. The read data is compared with the expected value data r0, r1, r2. In parallel to the write and read operations for the port 1, the disturb information such as i0, i1, i2 is given to the port 2.

FIG. 11 illustrates an example of flowchart of the testing method for the semiconductor integrated circuit such as the microcomputer 1. First, the test control information is given from external circuits of bridge circuit, for example, from the tester. A signal for test given from the common test bus is selected with the signal te (S1), the write data is developed (S2) and the address conversion of bit format for the write address is performed (S3). For the address conversion result, the overflow check of address is executed. The write data is written to the memory based on the address signal in which the bit format is converted (S4). After the write process, the data (return value q) is read from the written address and it is then compared with the expected value br_ref (S5). When the result of comparison is matched, the process is completed (normal end). When the result of comparison is mismatched, the signal br_async_out=1 is outputted (S6), the error flag EFLG is latched by the latch circuit 41 (S7) and an error generation address is latched by the latch circuit 40 (S8). Thereafter, the clock br_sck is supplied (S9) and the error flag and error generation address are scanned out in synchronization with supply of the clock (S10). Finally, a scan register 42 and latch circuits 40, 41 are cleared (S11) to complete the process.

According to the microcomputer 1 described above, following effects may be attained.

[1] Even when the test data information is supplied in parallel to a plurality of memories 11 to 15 in different access data widths, the data development circuits 35, 52 of the bridge circuits 21 to 25 convert the test data information to the inherent access data width of the corresponding memory. Moreover, even when the test address information is supplied in parallel to a plurality of memories 11 to 15 of different address decode logics, the address conversion circuits 36, 53 of the bridge circuits 21 to 25 convert the test address information to the inherent bit format of the corresponding memory. Therefore, the memory test efficiency due to the match pattern for a plurality of on-chip memories can be improved in the point that the test data information can be supplied in parallel to a plurality of memories of different access data widths and in the point that the address scan direction in the memories for the test address information can be uniformed to a particular direction depending on the inherent bit format.

[2] The bridge circuits 21 to 25 compare the read information from the memories 11 to 15 with the expected value information from the common test bus 31 by the comparison circuit 38 and latches a fault information of the memory to the address latch circuit 40 and comparison result latch circuit 41 depending on the comparison result. The fault address is latched by the address latch circuit 40, while the fault comparison result is latched as the error flag EFLG by the comparison result latch circuit 41. Accordingly, the parallel test result for a plurality of memories can be sequentially obtained in serial from the latch circuits 40, 41. The parallel test result can be sequentially outputted to the external side from the latch circuits 40, 41 by introducing the shift register 42 for scan path as a means for outputting the latch information of the latch circuits 40, 41 to the external side.

In this case, the latch circuit 41 of the error flag EFLG of scan path is allocated on the upstream side of the scan path upper than the error address latch circuit 40. Therefore, when the scan clocks are counted up until the error flag EFLG appears, the error generating memory can be identified based on such counted value and the error generating address in the error generating memory can also be identified with the just preceding address information. As described above, a fault generating location can be identified easily.

[3] The bridge circuits 21 to 25 include logical sum gates 43 for obtaining the logical sum of the comparison result of the comparison circuit 38 and the comparison result output of another bridge circuit and outputting such logical sum to still another bridge circuit. Therefore, when the logical sum gate 43 in a plurality of bridge circuits 21 to 25 is formed through serial connection so that output of the logical sum gate of the preceding stage is connected to the input of the logical sum gate of the next stage, continuation or suspension (Go/No go) of test can be judged while the parallel tests are being performed to a plurality of memories by monitoring the output of the logical sum gate 43 of the final stage when a comparison mismatch error is generated in a certain memory in the course of the sequential parallel tests through the address scan by updating the test address information while the test data information is updated for a plurality of memories 11 to 15.

[4] Since the bridge circuits 24, 25 corresponding to the multi-port memories 14, 15 are capable of inputting the disturb information to the port which is selected for non-connection to the common test bus 31 for the port connected to the common test bus 31, when the multi-port is provided, the port-to-port interference test can also be used in common and thereby the reliability of test for the multi-port memory can be improved.

The present invention has been described based on the embodiment thereof but the present invention is never limited thereto and naturally allows various changes or modifications within the scope not departing from the claims thereof.

For example, the number of memories included in the memory block, storage capacity of memory, data access width and information storage system or the like may be changed as required. The memory is never limited to SRAM and a DRAM or a non-volatile memory may also be used. A circuit block other than the memory is not limited to an MPU illustrated in FIG. 2 and may be changed as required. The multi-port memory is not limited to the structure having the dual-port and is also allowed to provide the structure having many ports.

The typical inventions disclosed in the present invention will be described as follows.

Namely, the bridge circuit can convert the test data information to the inherent access data width of the corresponding memory by also supplying in parallel the test data information to a plurality of memories of different access data widths. Moreover, the bridge circuit can convert the test address information to the inherent bit format of the corresponding memory by also supplying in parallel the test address information to a plurality of memories of different address decode logics. Therefore, the memory test efficiency due to the match pattern for a plurality of on-chip memories can also be improved in the point that the test data information can be supplied in parallel to a plurality of memories of different access data widths and in the point that the address scan direction in respective memories for the test address information can be uniformed to a particular direction according to the inherent bit format.

What is claimed is:

1. A semiconductor integrated circuit comprising:
a plurality of memories of different address decode logics;
logical circuits for controlling access to said plurality of memories,
a common test bus connected to the plurality of memories; and
a plurality of bridge circuits which convert test address information from said common test bus to an inherent bit format of each memory and supply said data to a corresponding memory,
wherein the common test bus and the plurality of bridge circuits are provided in order to enable parallel tests by supplying in parallel the test address information to the plurality of memories from the common test bus and
wherein at least one memory among the plurality of memories is a multi-port memory and the bridge circuit corresponding to said multi-port memory enables selection of a port connected to said common test bus and input of disturb information to the port selected not to be connected to said common test bus.

2. A semiconductor integrated circuit according to claim 1, wherein said bridge circuit can select a convertible bit format depending on test control information.

3. A semiconductor integrated circuit according to claim 1, wherein said bridge circuit comprises a comparing means for comparing read information from the memories with expected value information from the common test bus and a latch means for latching fault information of memory depending on a result of comparison by said comparing means.

4. A semiconductor integrated circuit according to claim 3, wherein said latch means is comprised of an address latch means for latching a fault address and a fault flag means for latching a comparison result of fault.

5. A semiconductor integrated circuit according to claim 4, wherein said bridge circuit comprises a shift register means for scanning a path which provides a serial output by inputting an output of said latch means.

6. A semiconductor integrated circuit according to claim 1, wherein said bridge circuit comprises a comparing means for comparing read information from the memory with a expected value information from the common test bus and a gate means which obtains a logical sum of a comparison result by said comparing means and a comparison result output from another bridge circuit and provides an output to still another bridge circuit, and a plurality of said gate means are connected in series so that an output of the gate means of a preceding stage is connected to an input of the gate means of a next stage.

7. A testing method for testing in parallel a plurality of memories of different address decode logics via the common test bus, comprising the steps of: supplying test address information to said common test bus; inputting the test address information from said common test bus to convert to an inherent bit format of a corresponding memory; writing in parallel a test data to the corresponding memory using the converted test address information; reading the written test data from the plurality of memories; and comparing the read test data with expected value information in a unit of the memory to generate memory error information, wherein at least a memory among the plurality of memories is a multi-port memory and the disturb information is inputted to a port other than that connected to said common test bus for said multi-port memory.

* * * * *